United States Patent
Sundararajan et al.

(10) Patent No.: US 9,286,221 B1
(45) Date of Patent: *Mar. 15, 2016

(54) HETEROGENEOUS MEMORY SYSTEM

(71) Applicant: Reniac, Inc., San Jose, CA (US)

(72) Inventors: Prasanna Sundararajan, San Jose, CA (US); Chidamber Kulkarni, Kondapur (IN)

(73) Assignee: Reniac, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/680,878

(22) Filed: Apr. 7, 2015

Related U.S. Application Data

(63) Continuation-in-part of application No. 13/910,355, filed on Jun. 5, 2013, now Pat. No. 9,043,557.

(60) Provisional application No. 61/656,123, filed on Jun. 6, 2012.

(51) Int. Cl.
 *G06F 12/08* (2006.01)
 *G11C 7/10* (2006.01)

(52) U.S. Cl.
 CPC ........ *G06F 12/0811* (2013.01); *G06F 12/0862* (2013.01); *G06F 12/0873* (2013.01); *G06F 12/0888* (2013.01); *G11C 7/1072* (2013.01); *G06F 2212/283* (2013.01)

(58) Field of Classification Search
 CPC ............ G06F 12/0811; G06F 12/0862; G06F 12/0873; G06F 12/0888
 See application file for complete search history.

(56) References Cited

U.S. PATENT DOCUMENTS

| | | | | |
|---|---|---|---|---|
| 5,699,548 | A * | 12/1997 | Choudhury et al. | 711/142 |
| 6,446,617 | B2 * | 9/2002 | Bianchi et al. | 123/568.17 |
| 2011/0138221 | A1 * | 6/2011 | Hanaoka et al. | 714/6.1 |
| 2011/0238953 | A1 * | 9/2011 | Metsugi et al. | 712/207 |

* cited by examiner

*Primary Examiner* — Hiep Nguyen
(74) *Attorney, Agent, or Firm* — Crawford Maunu PLLC

(57) ABSTRACT

A heterogeneous memory system includes a main memory arrangement, a first-level cache, a second-level cache, and a memory management unit (MMU). The first-level cache includes an SRAM arrangement and the second-level cache includes a DRAM arrangement. The MMU is configured and arranged to read first data from the main memory arrangement in response to a stored first value associated with the first data and indicative of a start time. The MMU selects one of the first-level cache or the second-level cache for storage of the first data and stores the first data in the selected one of the first or second-level caches. The MMU reads second data from one of the first-level cache or second-level cache and writes the data to the main memory arrangement in response to a stored second value associated with the second data and indicative of a duration.

25 Claims, 4 Drawing Sheets

HETEROGENEOUS MEMORY SYSTEM

CROSS REFERENCE TO CO-PENDING APPLICATION

This application is a continuation in part of U.S. Pat. No. 9,043,557, by Sundararajan et al., entitled "HETEROGENEOUS MEMORY SYSTEM," and issued on May 26, 2015, which claims priority to provisional patent application No. 61/656,123, entitled "HETEROGENEOUS MEMORY SYSTEM," and filed on Jun. 6, 2012.

FIELD OF THE INVENTION

One or more embodiments generally relate to memory systems.

BACKGROUND

Present memory systems often include static random-access memory (SRAM), dynamic random-access memory (DRAM), and non-volatile storage, such as a hard disk or solid-state memory (e.g., flash memory). Typically SRAM is a memory that is at a lower level in the memory hierarchy and receives memory access requests from the processing element(s). If the requested data is not present in SRAM, the DRAM memory is queried for presence of the requested data. If the data is not present in DRAM, the data is retrieved from non-volatile storage, which contains all of the program instructions and data required for the execution of the program.

Since SRAM is fast relative to DRAM, SRAM is often used to implement caches. Since DRAM is less expensive than SRAM and requires fewer transistors, DRAM is often used to implement the main memory in a memory system hierarchy.

SUMMARY

In one embodiment, a heterogeneous memory system includes a main memory arrangement, a first-level cache, a second-level cache, and a memory management unit (MMU). The first-level and second-level caches cache data from the main memory arrangement. The first-level cache includes an SRAM arrangement, and the second-level cache includes a DRAM arrangement. The MMU is coupled to the first-level and second-level caches and to the main memory arrangement. The MMU is configured and arranged to read first data from the main memory arrangement in response to a stored first value associated with the first data, the stored first value indicative of a start time relative to initiation of execution of a program that accesses the first data. The MMU selects one of the first-level cache or the second-level cache for storage of the first data and stores the first data in the selected one of the first-level cache or second-level cache. The MMU is further configured and arranged to read second data from one of the first-level cache or second-level cache and write the data to the main memory arrangement in response to a stored second value associated with the second data. The stored second value indicates a duration for which the second data is accessed during execution of the program.

In another embodiment, a data processing system is provided. The data processing system includes a processing element in combination with the heterogeneous memory system described above.

A method of determining data layout in a memory arrangement for data accessed by a program is provided in another embodiment. The method includes determining for each of a plurality of data sets accessed by the program, a respective start time and a respective duration. The start time indicates a time that the program accesses the data set relative to initiation of execution of the program, and the duration indicates a time for which the data set is accessed during execution of the program. Values indicative of the respective start times and durations are stored for use by a memory management unit (MMU) during execution of the program. The method also determines for each data set, whether the data set should be cached in an SRAM memory arrangement in a first-level cache or in a DRAM memory arrangement in a second-level cache. A respective value is stored for each data set to indicate whether the data set should be cached in the first-level cache or the second-level cache. The MMU uses each respective value during execution of the program.

In other embodiments of a heterogeneous memory system, both the first-level and second-level caches may include SRAM arrangements or both the first-level and second-level caches may include DRAM arrangements.

Other embodiments will be recognized from consideration of the Detailed Description and Claims, which follow.

BRIEF DESCRIPTION OF THE DRAWINGS

Various aspects and advantages of the disclosed embodiments will become apparent upon review of the following detailed description and upon reference to the drawings in which.

DETAILED DESCRIPTION OF THE DRAWINGS

The disclosed heterogeneous memory system and data processing system employ SRAM in a first-level cache, DRAM in a second-level cache, and flash memory in a main memory. A memory management unit (MMU) is coupled to the SRAM arrangement, the DRAM arrangement, and to a main memory arrangement of the system.

The MMU uses data obtained in prior program analysis to determine when data is to be fetched from the main memory arrangement and stored in the SRAM of the first-level cache or the DRAM of the second-level cache and when data in the first-level cache is to be evicted.

In prior multi-level cache systems, the contents of the first-level cache, which may be implemented using SRAM, are a subset of the contents of the second-level cache, which may be implemented using DRAM. In the disclosed methods and systems, the first-level cache need not be a subset of the second-level cache. At design or compile time, the access pattern of the data is assessed, and placement of data in the first-level or second-level cache is determined. The data in the first-level cache need not be a subset of the data in the second-level cache.

Figure 1:
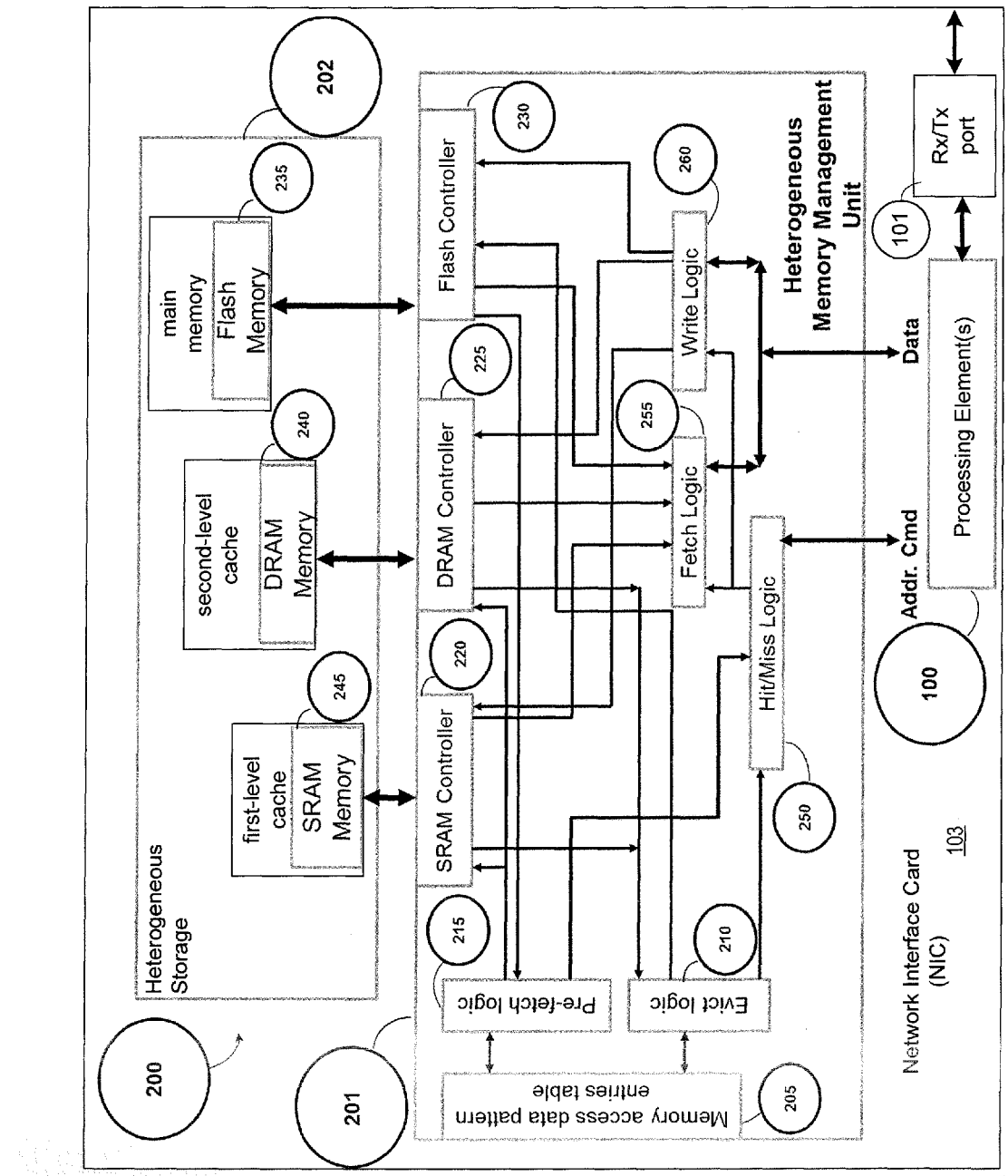
FIG. 1 shows an example heterogeneous memory system.

FIG. 1 shows an example heterogeneous memory system 200. Heterogeneous memory system 200 includes heterogeneous storage 202 and a memory management unit (MMU) 201. The heterogeneous storage 202 includes main memory, a second-level cache, and a first-level cache. The main memory includes one or more flash memory devices (arrangement) 235, the second-level cache includes one or more DRAM memory devices (arrangement) 240, and the first-level cache includes one or more SRAM memory devices (arrangement) 245. The flash memory may serve as a system main memory depending on implementation requirements. The heterogeneous storage stores data during the operation of an application program. In alternative implementations, the first-level and second-level caches and the main memory may include types of memory other than the types indicated above. For example, both the first-level and second-level caches may include one or more DRAM memory devices, or both the first-level and second-level caches may include SRAM memory devices. The main memory may include DRAM memory devices.

A working set is defined as the data that is needed by the application over a moving time window. A goal of the MMU 201 is to maximize the availability of the working set data in first-level cache SRAM and/or second-level cache DRAM. A function of the MMU is to manage the access to the data stored in the heterogeneous storage 202 and optimize the data request to and from the processing element and optimization being defined as faster access to the data while increasing the reliability of the flash memory arrangement. For instance, SRAM has the fastest access times among the three memory storage technologies, and DRAM has faster access times than flash storage. Thus the functions of the MMU include caching the data as much as possible in first-level cache SRAM and/or second-level cache DRAM; pre-fetching the data into first-level cache SRAM and/or second-level cache DRAM from flash memory; and limiting the number of write operations into main memory having flash memory to increase the reliability of the flash memory.

Memory management unit 201 includes logic for managing access to the heterogeneous storage and for moving data between the main memory having flash memory and first-level cache SRAM and second-level cache DRAM arrangements. The memory access data pattern entries table 205 is an example of a storage element that stores information that describes data sets accessed by an application program. The information that describes each data set includes an address of the data set, a first time value (start time) that indicates the time at which the application program accesses the data set, and a second time value (duration) that indicates the period of time for which the program will continue to access the data set. In an alternative implementation, a directory or other format may be used to store the information that describes the data sets.

Evict logic 210 is responsible for evicting a data set from first-level cache SRAM or second-level cache DRAM once the duration of the data set in the first-level cache SRAM or second-level cache DRAM has ended. Evict logic 210 reads the memory access data pattern entries table 205 and determines which data set needs to be read from first-level cache SRAM or second-level cache DRAM and written back to the main memory flash memory devices 235. The data set is moved ahead of an actual need to move data to make space for a new data set in the first-level cache SRAM or second-level cache DRAM.

Pre-fetch logic 215 is responsible for pre-fetching a data set before the actual time of use by the processing element. Pre-fetch logic 215 reads the memory access data pattern entries table 205 and determines which data set, at a specific moment in time and ahead of the actual read request for the data set, needs to be read from a flash memory device of main memory and written to either the first-level cache SRAM or second-level cache DRAM.

SRAM controller 220 is responsible for reading data from and writing data to the SRAM memory arrangement of the first-level cache. An example controller includes a state machine that performs a sequence of operations to implement read and write operations on the SRAM memory arrangement and includes an interface to accept commands that request read and write operations. An example interface communicates an address, a command (read or write), and the data read or to be written.

DRAM controller 225 is responsible for reading data from and writing data to the DRAM memory arrangement of the second-level cache. An example controller includes a state machine that performs a sequence of operations to implement read and write operations on the DRAM memory arrangement and includes an interface to accept commands that request read and write operations. An example interface communicates an address, a command (read or write), and the data read or to be written.

Flash controller 230 is responsible for reading data from and writing data to the flash memory arrangement of the main memory. An example controller includes a state machine that performs a sequence of operations to implement read and write operations on the flash memory arrangement and an interface to accept commands to perform read or write operations. An example interface communicates an address, a command (read or write), and the data read or to be written.

Hit/miss logic 250 receives an address corresponding to a read or write request and is responsible for determining if the requested data set is present in first-level cache SRAM or second-level cache DRAM. The Hit/Miss logic maintains a Data Allocation Table (not shown), which includes entries for data sets that are present in the first-level cache SRAM and second-level cache DRAM memory arrangements. This table is used by the Hit/miss logic 250 to determine whether an address of the read/write request is present in the first-level cache SRAM arrangement or is present in the second-level cache DRAM arrangement and pass the control to the appropriate logic block to service the request.

When data is initially written to the main memory (flash memory 235), the hit/miss logic 250 will also determine whether the pre-fetch logic 215 will move a copy of this data to either first-level cache SRAM 245 or second-level cache DRAM 240. Note that at design time the decision to use first-level cache SRAM or second-level cache DRAM memory was made, and appropriate tags stored in the memory access data pattern entries table 205 indicate whether data initially written to the main memory is copied to the first-level cache SRAM or second-level cache DRAM. At design time (or compile-time), whether a particular data is accessed many times may be determined and an appropriate tag may be set in the memory access data pattern table to indicate that the data will be mapped in first-level cache SRAM. Alternatively, for data that is reused infrequently, that data may be mapped to second-level cache DRAM and prevented from being caching in the first-level cache SRAM. For data that is written and read only once or twice only, tags may be set to prevent the caching of that data in either first-level cache SRAM or second-level cache DRAM and to force fetching from and writing to main memory. Preventing the caching of certain data may be useful to avoid pollution of the first and second-level caches with data that is not reused.

Fetch logic 255 is responsible for fetching the data from the first-level cache SRAM, second-level cache DRAM, or main memory flash memory arrangements. The fetch logic 255 receives control from the Hit/miss logic 250 along with the information of where the data is present, in either the first-level cache SRAM, second-level cache DRAM or main memory flash memory arrangements, and the fetch logic retrieves the data from the specified memory device and returns the data to the requesting processing element 100.

When a request for fetching (read) data is received, the hit/miss logic will already have information (based on tags set earlier using pre-fetch logic) that indicates the requested data is present either in the first-level cache SRAM or second-level cache DRAM. The hit/miss logic will direct the request to the appropriate memory.

Write logic 260 is responsible for writing data to first-level cache SRAM, second-level cache DRAM, or the main memory flash memory arrangement. The write logic 260 receives control from the Hit/miss logic 250 along with address information that indicates where the data is to be written in the first-level cache SRAM, second-level cache DRAM, or main memory flash memory arrangements. The write logic writes the data to the appropriate memory device.

In an implementation of a data processing system, one or more processing elements 100 may be coupled to the MMU. The processing elements may be parallel processing elements, application-specific integrated circuits (ASIC), or a central processing unit (CPU), for example. The processing element may execute programs compiled from applications written in high level languages such as C/C++, or the processing element may implement circuitry specified in hardware description languages such as Verilog or VHDL. The processing elements, heterogeneous storage, and MMU may also be alternatively implemented on resources of one or more field programmable gate arrays (FPGAs) or in system-on-chip (SoC) having programmable logic resources.

The processing element(s) 100, heterogeneous MMU 201, and heterogeneous storage 200 may be implemented on a network interface card (NIC) 103, or integrated with a CPU as a System on Chip, for example. The processing element(s) are coupled to a receive/transmit port circuit 101, which conveys requests over a connected network, such as an Ethernet network. The circuitry may be implemented in a field programmable gate array (FGPA), as an application specific integrated circuit (ASIC), as part of a CPU architecture, or in various combinations of the forgoing. The MMU and its components may be designed using a hardware description language (HDL), a register transfer language (RTL), or a high-level programming language such as C or C++, for example. A high-level programming language differs from an HDL and RTL in that a program written in a high-level programming language may be compiled into instructions that are executable by a microprocessor.

Figure 2:
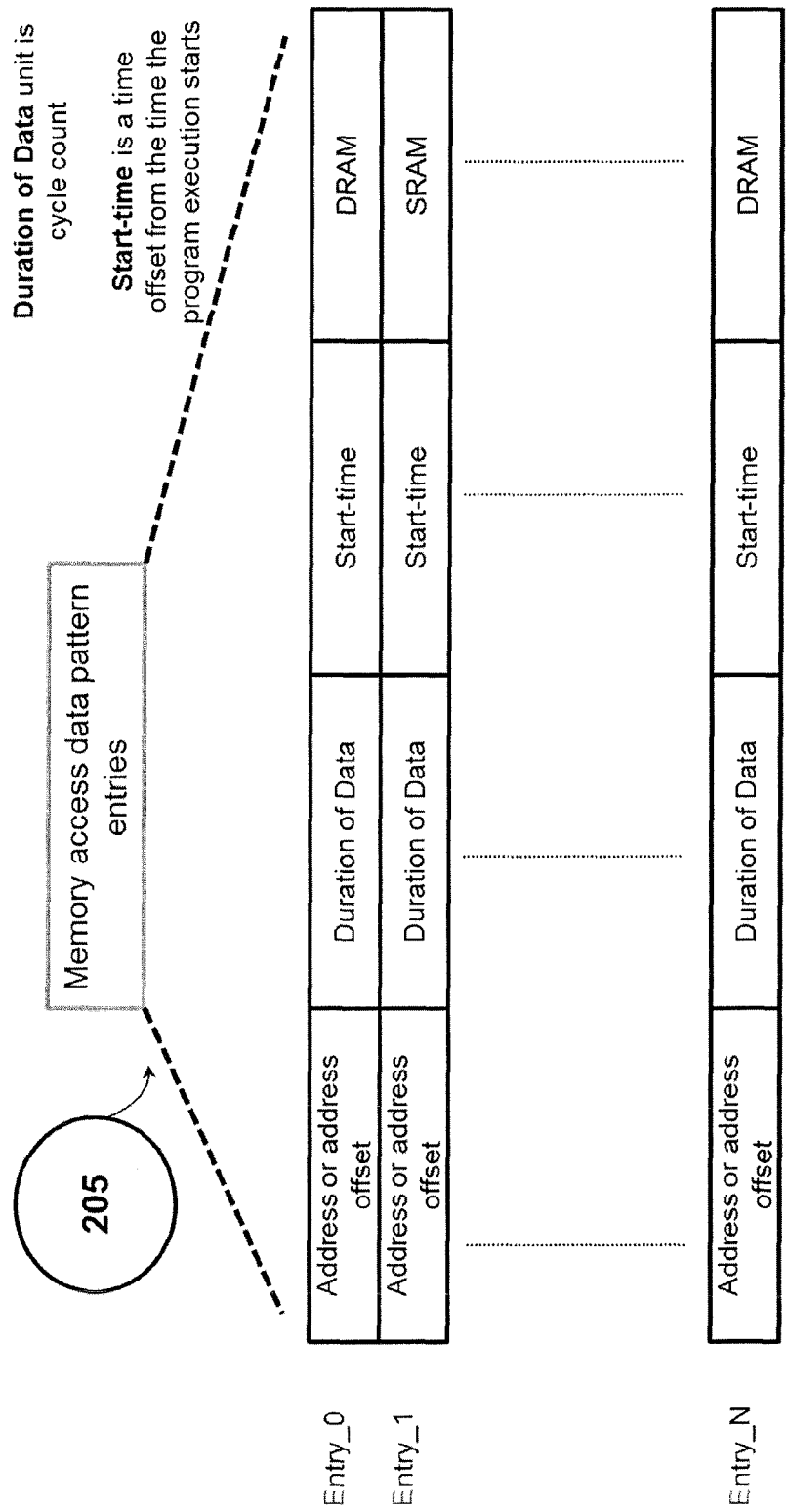
FIG. 2 shows an example memory access data pattern entries table.

FIG. 2 shows an example memory access data pattern entries table 205. The memory access data pattern entries table contains respective entries for data sets that will be used in an application. Each entry includes an address or address offset, a value indicating a start-time at which the data set will be used in an application, a duration of a memory data, and a value indicating whether the data set should be cached in the first-level cache SRAM or second-level cache DRAM. The data layout (cache in first-level cache SRAM or second-level cache DRAM) of the memory at run time is controlled by the contents of the memory access data pattern entries table. Thus the contents of the memory access data pattern entries table specify the application-specific data layout.

The memory management unit will use the entries in the memory access data pattern entries table to pre-fetch data sets into the first-level cache SRAM and/or second-level cache DRAM from the main memory flash memory. A data set may be pre-fetched ahead of an actual request to access the data set by the application. The main memory flash memory is large enough to hold the application data and stores all the data used by an application.

A program may be analyzed to determine the desired data layout. Depending on the life-time of a data set and frequency of use of the data set, the analysis determines if the data should be cached in first-level cache SRAM or second-level cache DRAM, as well as when the data set should be prefetched and evicted from cache. This information is stored in the memory access data pattern entries table.

The memory access data pattern entries table may be determined by either static compiler analysis or dynamic run-time analysis. An application written in high level language such as C/C++ or hardware description language may be analyzed for data access patterns. The output of this analysis is a table of address offsets, values that indicate durations of the time during which respective data sets are going to be actively used in an application, and start-times that denote the earliest time at which a data set will be used in an application.

Dynamic run-time analysis of an application program may be performed to deal with scenarios in which the compiler cannot statically determine the data usage patterns. Data dependency may be one such scenario. During these scenarios, the application program will be instrumented to create an instrumented version, and the user may be requested to run the program in a "test_mode". In executing the instrumented application program, data usage patterns are gathered, and the information needed to populate the memory access data pattern entries table is extracted.

In an alternative implementation, the memory access data pattern may be characterized in microcode that specifies the schedule of pre-fetch. For instance, the output of the compiler analysis or dynamic run-time analysis can be further analyzed, and microcode can be generated containing the schedule for pre-fetching data sets to the first-level cache SRAM or second-level cache DRAM and for eviction of the data sets.

Figure 3:
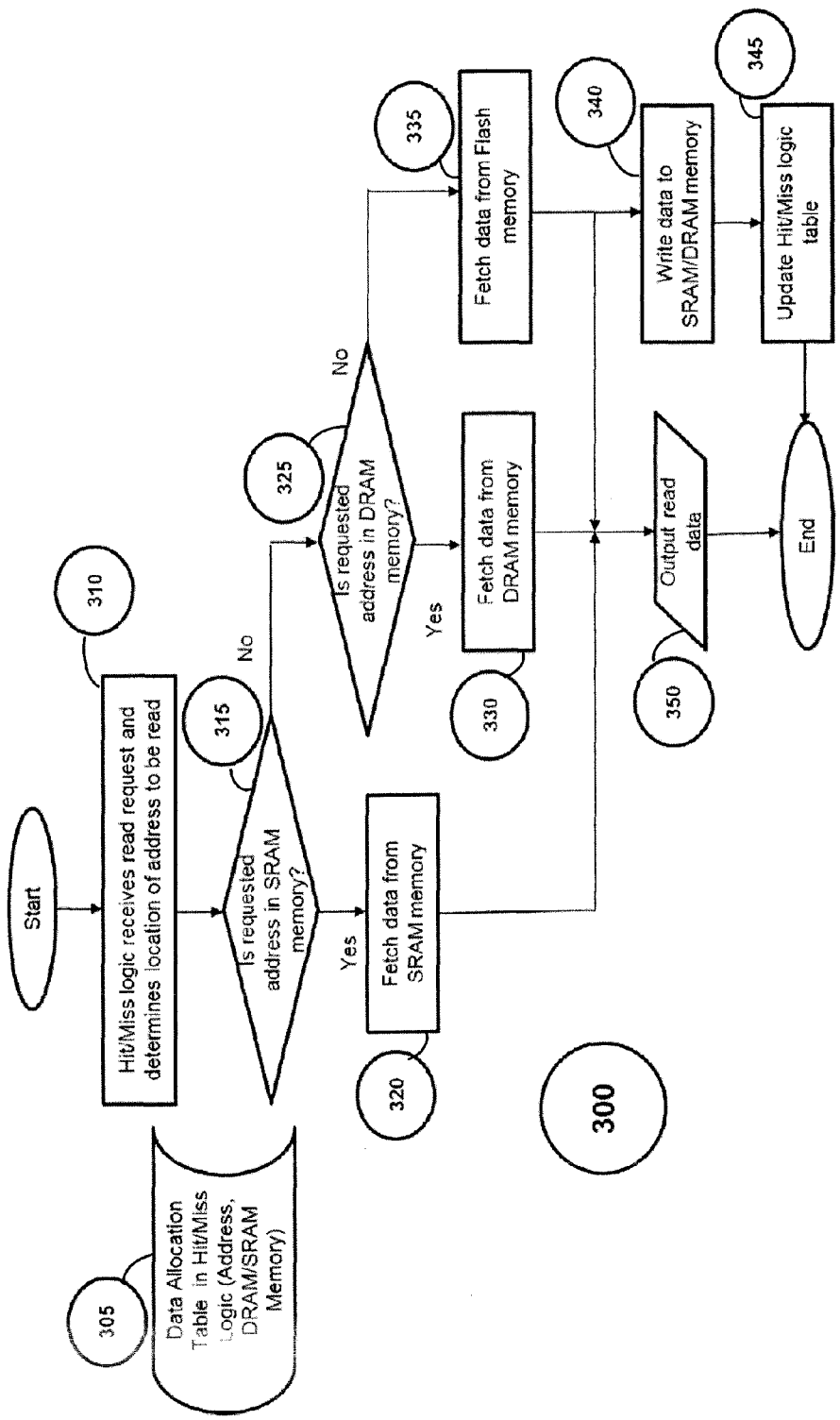
FIG. 3 is a flowchart of an example process for processing a read request.

FIG. 3 is a flowchart of an example process 300 for processing a read request. The data allocation table 305 stores the addresses of data sets present in first-level cache SRAM and/or second-level cache DRAM. At block 310, the Hit/Miss logic receives a read request from a processing element. In response to receipt of the read request, the Hit/Miss logic determines the location of the data set. Specifically, the Hit/Miss logic determines whether the data to be read is in the first level cache SRAM or the second-level cache DRAM or is in the flash memory of the main memory. At decision block 315, the process determines whether or not the data set is present in the first-level cache SRAM arrangement. If the requested data is present, the data is fetched from the first-level cache SRAM arrangement at block 320. Otherwise, at decision block 325, the process determines whether or not the data set is present in the second-level cache DRAM arrangement. If the data set is present in the second-level cache DRAM arrangement, the data set is fetched from the second-level cache DRAM arrangement at block 330. If the data set is not present in the second-level cache DRAM arrangement, the data set is fetched from the flash memory at block 335. At block 350, the fetched data set is output to the requesting processing element.

At block 340, the data set fetched from flash memory of the main memory is written to the first-level cache SRAM arrangement or to the second-level cache DRAM arrangement, depending on the corresponding indicator value in the memory access data pattern entries table 205. At block 345, the data allocation table 305 in Hit/Miss logic is updated with the location (SRAM or DRAM) of the data fetched from the flash device.

Figure 4:
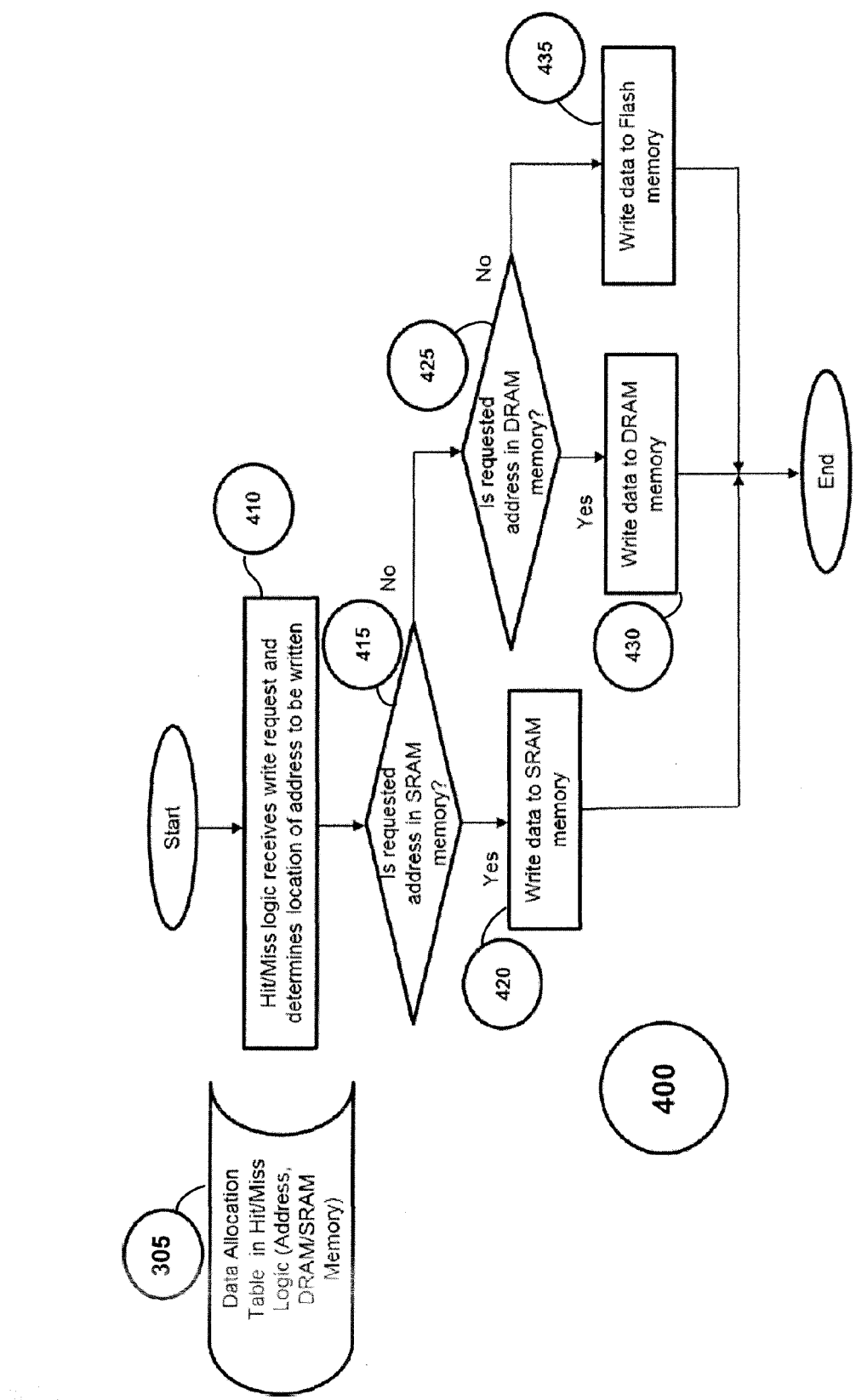
FIG. 4 is a flowchart of an example process for processing a write request.

FIG. 4 is a flowchart of an example process 400 for processing a write request. At block 410, the Hit/Miss logic receives a write request from a processing element. In response to receipt of the write request, the Hit/Miss logic determines whether the address for the data to be written is in the first-level cache SRAM arrangement, the second-level cache DRAM arrangement or in the flash memory of the main memory. Decision block 415 determines whether or not the requested address is in the first-level cache SRAM arrangement. If so, at block 420, the data is written to the first-level cache SRAM arrangement. Otherwise, decision block 425 determines whether or not the requested address is in the second-level cache DRAM arrangement. If so, the data is written to the second-level cache DRAM arrangement at block 430. If the requested address is not in the second-level cache DRAM arrangement, at block 435 the data is written to the flash memory.

Though aspects and features may in some cases be described in individual figures, it will be appreciated that features from one figure can be combined with features of another figure even though the combination is not explicitly shown or explicitly described as a combination.

The embodiments are thought to be applicable to a variety of memory systems. Other aspects and embodiments will be apparent to those skilled in the art from consideration of the specification. The embodiments may be implemented as one or more processors configured to execute software, as an application specific integrated circuit (ASIC), or as a logic on a programmable logic device. It is intended that the specification and illustrated embodiments be considered as examples only, with a true scope of the invention being indicated by the following claims.

What is claimed is:

1. A heterogeneous memory system, comprising:
a main memory arrangement;
a first-level cache for caching data from the main memory arrangement, the first-level cache including an SRAM arrangement;
a second-level cache for caching data from the main memory arrangement, the second-level cache including a DRAM arrangement;
a memory management unit (MMU) coupled to the first-level cache, the second-level cache, and to the main memory arrangement, the memory management unit configured and arranged to:
read a first data set from the main memory arrangement in response to a stored first value associated with the first data set, the stored first value indicative of a start time relative to initiation of execution of a program that accesses the first data set;
select one of the first-level cache or the second-level cache for storage of the first data set;
store the first data set in the selected one of the first-level cache or second-level cache; and
read a second data set from one of the first-level cache or the second-level cache and write the data to the main memory arrangement in response to a stored second value associated with the second data set, the stored second value indicative of a duration for which the second data set is accessed during execution of the program.

2. The heterogeneous memory system of claim 1, wherein the main memory arrangement includes flash memory.

3. The heterogeneous memory system of claim 1, wherein the MMU includes a storage element configurable with addresses and respectively associated values indicating start times and durations for data sets accessed by a program.

4. The heterogeneous memory system of claim 3, wherein the storage element is further configurable with values respectively associated with the addresses stored in the storage element for indicating whether data sets referenced by the addresses are to be stored in the first-level cache or the second-level cache.

5. The heterogeneous memory system of claim 1, wherein the MMU is further configured and arranged to read the first data set from the main memory arrangement and store the first data set in one of the first-level cache or the second-level cache prior to receiving a request for access to the first data set.

6. The heterogeneous memory system of claim 1, wherein the MMU is further configured and arranged to read the second data set from one of the first-level cache or the second-level cache and write the data to the main memory arrangement prior to detecting a need to remove data from the first-level cache to make space available in the first-level cache for data other than the second data set.

7. The heterogeneous memory system of claim 1, wherein the main memory arrangement, the first-level cache, the second-level cache, and the MMU are disposed on a network interface card.

8. The heterogeneous memory system of claim 1, wherein the main memory arrangement, the first-level cache, the second-level cache, and the MMU are implemented on a system on chip.

9. A data processing system, comprising:
a processing element;
a main memory arrangement;
a first-level cache for caching data from the main memory arrangement, the first-level cache including an SRAM arrangement;
a second-level cache for caching data from the main memory arrangement, the second-level cache including a DRAM arrangement;
a memory management unit coupled to the processing element, the first-level cache, the second-level cache, and to the main memory arrangement, the memory management unit (MMU) configured and arranged to:
read first data from the main memory arrangement in response to a stored first value associated with the first data, the stored first value indicative of a start time relative to initiation of execution on the processing element of a program that accesses the first data;
select one of the first-level cache or the second-level cache for storage of the first data;
store the first data in the selected one of the first-level cache or second-level cache; and
read second data from one of the first-level cache or second-level cache and write the data to the main memory arrangement in response to a stored second value associated with the second data, the stored second value indicative of a duration for which the second data is accessed during execution of the program.

10. The data processing system of claim 9, wherein the main memory arrangement includes flash memory.

11. The data processing system of claim 9, wherein the MMU includes a storage element configurable with addresses and respectively associated values indicating start times and durations for data sets accessed by a program.

12. The data processing system of claim 11, wherein the storage element is further configurable with values respectively associated with the addresses stored in the storage element for indicating whether data sets referenced by the addresses are to be stored in the first-level cache or the second-level cache.

13. The data processing system of claim 9, wherein the MMU is further configured and arranged to read the first data from the main memory arrangement and store the first data in one of the first-level cache or the second-level cache prior to receiving a request for access to the first data.

14. The data processing system of claim 9, wherein the MMU is further configured and arranged to read the second data from one of the first-level cache or the second-level cache and write the data to the main memory arrangement prior to detecting a need to remove data from the first-level cache or second-level cache to make space available in the first-level cache or second-level cache for data other than the second data.

15. The data processing system of claim 9, wherein the processing element is implemented on a field programmable gate array (FPGA).

16. The data processing system of claim 9, wherein the processing element is implemented on an application specific integrated circuit (ASIC).

17. The data processing system of claim 9, wherein the processing element is a central processing unit.

18. The data processing system of claim 9, wherein the processing element, main memory arrangement, the first-level cache, the second-level cache, and the MMU are disposed on a network interface card.

19. The data processing system of claim 9, wherein the processing element, the main memory arrangement, the first-level cache, the second-level cache, and the MMU are implemented on a system on chip.

20. A method of determining data layout in a memory arrangement for data accessed by a program, comprising:
    determining for each of a plurality of data sets accessed by the program, a respective start time and a respective duration, the start time indicative of a time that the program accesses the data set relative to initiation of execution of the program, and the duration indicative of a time for which the data set is accessed during execution of the program;
    storing values indicative of the respective start times and durations for use by a memory management unit (MMU) during execution of the program;
    determining for each data set, whether the data set should be cached in a first-level cache or a second-level cache, the first-level cache including an SRAM memory arrangement, and the second-level cache including a DRAM memory arrangement; and
    storing a respective value for each data set indicative of whether the data set should be cached in the first-level cache or the second-level cache, each respective value for use by the MMU during execution of the program.

21. The method of claim 20, wherein the determining steps and storing steps are performed during compilation of the program.

22. The method of claim 20, wherein the determining steps and storing steps are performed during execution of an instrumented version of the program.

23. The method of claim 21, further comprising implementing the MMU using a high-level programming language, a hardware description language, or a register transfer language, or a combination thereof.

24. A heterogeneous memory system, comprising:
    a main memory arrangement;
    a first-level cache for caching data from the main memory arrangement, the first-level cache including an SRAM arrangement;
    a second-level cache for caching data from the main memory arrangement, the second-level cache including an SRAM arrangement;
    a memory management unit (MMU) coupled to the first-level cache, the second-level cache, and to the main memory arrangement, the memory management unit configured and arranged to:
        read a first data set from the main memory arrangement in response to a stored first value associated with the first data set, the stored first value indicative of a start time relative to initiation of execution of a program that accesses the first data set;
        select one of the first-level cache or the second-level cache for storage of the first data set;
        store the first data set in the selected one of the first-level cache or second-level cache; and
        read a second data set from one of the first-level cache or the second-level cache and write the data to the main memory arrangement in response to a stored second value associated with the second data set, the stored second value indicative of a duration for which the second data set is accessed during execution of the program.

25. A heterogeneous memory system, comprising:
    a main memory arrangement;
    a first-level cache for caching data from the main memory arrangement, the first-level cache including a DRAM arrangement;
    a second-level cache for caching data from the main memory arrangement, the second-level cache including a DRAM arrangement;
    a memory management unit (MMU) coupled to the first-level cache, the second-level cache, and to the main memory arrangement, the memory management unit configured and arranged to:
        read a first data set from the main memory arrangement in response to a stored first value associated with the first data set, the stored first value indicative of a start time relative to initiation of execution of a program that accesses the first data set;
        select one of the first-level cache or the second-level cache for storage of the first data set;
        store the first data set in the selected one of the first-level cache or second-level cache; and
        read a second data set from one of the first-level cache or the second-level cache and write the data to the main memory arrangement in response to a stored second value associated with the second data set, the stored second value indicative of a duration for which the second data set is accessed during execution of the program.

* * * * *